United States Patent
Voogel et al.

(10) Patent No.: US 7,452,765 B1
(45) Date of Patent: Nov. 18, 2008

(54) SINGLE EVENT UPSET IN SRAM CELLS IN FPGAS WITH HIGH RESISTIVITY GATE STRUCTURES

(75) Inventors: Martin L. Voogel, Los Altos, CA (US); Austin H. Lesea, Los Gatos, CA (US); Joseph J. Fabula, Tuscon, AZ (US); Carl H. Carmichael, San Jose, CA (US); Shahin Toutounchi, Pleasanton, CA (US); Michael J. Hart, Palo Alto, CA (US); Steven P. Young, Boulder, CO (US); Kevin T. Look, Fremont, CA (US); Jan L. de Jong, Cupertino, CA (US)

(73) Assignee: XILINX, Inc., San Jose, CA (US)

( * ) Notice: Subject to any disclaimer, the term of this patent is extended or adjusted under 35 U.S.C. 154(b) by 111 days.

(21) Appl. No.: 11/242,409

(22) Filed: Sep. 30, 2005

Related U.S. Application Data

(62) Division of application No. 10/402,446, filed on Mar. 27, 2003, now Pat. No. 6,982,451.

(51) Int. Cl.
*H01L 21/8238* (2006.01)
(52) U.S. Cl. .............. 438/200; 438/210; 257/379; 257/380
(58) Field of Classification Search .......... 257/536, 257/379–381, 154, 363; 365/154, 200; 438/200, 438/210
See application file for complete search history.

(56) References Cited

U.S. PATENT DOCUMENTS

| | | | |
|---|---|---|---|
| 4,879,690 A | | 11/1989 | Anami et al. |
| 5,126,279 A | * | 6/1992 | Roberts ................ 438/210 |
| 5,212,108 A | * | 5/1993 | Liu et al. .............. 438/385 |
| 5,905,290 A | | 5/1999 | Houston |
| 6,049,487 A | | 4/2000 | Plants et al. |
| 6,369,630 B1 | * | 4/2002 | Rockett ................ 327/210 |
| 6,656,803 B2 | | 12/2003 | Chan |
| 6,717,233 B1 | * | 4/2004 | Haddad et al. ........ 257/536 |
| 6,735,110 B1 | | 5/2004 | Lesea |
| 6,809,957 B2 | | 10/2004 | Lesea |
| 6,914,804 B2 | | 7/2005 | Lesea |
| 6,982,451 B1 | | 1/2006 | Voogel et al. |
| 7,214,990 B1 | * | 5/2007 | Lee et al. ............. 257/369 |

* cited by examiner

*Primary Examiner*—David Vu
*Assistant Examiner*—Thinh T Nguyen
(74) *Attorney, Agent, or Firm*—Justin Liu; Leroy D. Maunu

(57) ABSTRACT

SEU-hardening series resistances loads are formed within the gate structures of cross-coupled inverters of a latch. For some embodiments, the gate contact for the input of each cross-coupled inverter has a sufficiently high resistance to provide the SEU-hardening series resistance. For other embodiments, a conductive trace layer coupled to the input of each cross-coupled inverter includes a high-resistivity portion that provides the SEU-hardening series resistance.

11 Claims, 4 Drawing Sheets

SINGLE EVENT UPSET IN SRAM CELLS IN FPGAS WITH HIGH RESISTIVITY GATE STRUCTURES

FIELD OF THE INVENTION

The present invention relates generally to circuitry resistant to single event upset (SEU).

BACKGROUND OF THE INVENTION

A programmable logic device (PLD) is a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) from an external source into internal configuration memory cells that define how the CLBs, IOBs, and interconnect structure are configured. Thus, the collective states of the individual configuration memory cells determine the function of the FPGA.

A well-studied occurrence in circuitry is called Single Event Upset (SEU). SEU is an inadvertent change in state of a circuit caused by an external energy source such as, for example, cosmic rays, alpha particles, energetic neutrons, and the like. The energetic particles may randomly strike a semiconductor device and penetrate into the substrate (e.g., transistor source and drain regions) of the semiconductor device. These particle strikes create pairs of electrons and holes, which in turn cause undesirable transients that may upset circuit elements such as, for example, flipping the logic state of a latch or other memory element. As fabrication geometries and supply voltages continue to decrease, SEU problems become more severe. As a result, efforts to reduce SEU problems are increasingly important.

In a conventional DRAM or SRAM, SEU may be addressed with well-known error correction techniques. However, error correction may not be practical for FPGA configuration memory cells. For example, because an FPGA's configuration memory cells define how the FPGA's CLBs, IOBs, and interconnect structure are configured, inadvertent state changes in the configuration memory cells resulting from SEU transients may alter how the FPGA operates.

One approach to remedy SEU problems in configuration memory cells is to use triple modular redundancy (TMR). With TMR, individual memory cells are replaced with three sets of memory cells and configurable logic, where the outcome of at least two of the three sets controls FPGA operation. However, implementing TMR in an FPGA undesirably increases the size and cost of the FPGA.

Others have attempted to increase resiliency to SEU transients. For example, FIG. 1 shows an SEU-resistant memory cell 100 of the prior art. Memory cell 100 is a latch having cross-coupled inverters 102 and 104 coupled between complementary data terminals D and $\overline{D}$. Resistor R1, which is coupled between inverter 102 and inverter 104, delays transients caused by SEU particle strikes at the output of inverter 102 from reaching the input (and possibly changing the state) of inverter 104, which in turn gives inverter 104 more time to reset inverter 102 to its correct state. Similarly, resistor R2, which is coupled between inverter 104 and inverter 102, delays transients caused by SEU particle strikes at the output of inverter 104 from reaching the input (and possibly changing the state) of inverter 102, which in turn gives inverter 102 more time to reset inverter 104 to its correct state.

To provide SEU resiliency, resistors R1 and R2 each have a resistance of between approximately 100 kilo-ohms and one mega-ohm. Unfortunately, the formation of such large resistors consumes a relatively large amount of area and complicates integration with complementary-metal-oxide semiconductor (CMOS) processes.

Accordingly, it would be desirable and useful to provide an SEU-resistant memory circuit that consumes minimal silicon area and is suitable for integration with a CMOS process.

SUMMARY OF THE INVENTION

A latch is disclosed that includes SEU-resistant circuitry that reduces the latch's susceptibility to SEU transients while consuming minimal, if any, silicon substrate area. In accordance with some embodiments of the present invention, a latch having cross-coupled inverters includes SEU-hardening resistances formed within the gate structures of the cross-coupled inverters. In this manner, a transient upset to one of the inverters is not readily carried to the other inverter because it is slowed by the large series resistance formed within the SEU-resistant inverter's gate. The ability to include large SEU-hardening series resistances while consuming minimal, if any, silicon substrate area is advantageous. Further, the various SEU-hardening gate structures of present embodiments are easily integrated into CMOS fabrication processes.

For some embodiments, the gate contact for the input of each cross-coupled inverter is fabricated to have a relatively high series resistance that provides SEU-resiliency, while the source and drain contacts for the cross-coupled inverters are fabricated to have a relatively low resistance.

For other embodiments, the polysilicon gate for each cross-coupled inverter includes a high-resistivity region that provides SEU-resiliency.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are disclosed below in the context of an SRAM latch for simplicity only. It is to be understood that SEU-hardening embodiments of the present invention are equally applicable to other types of circuits, including flip-flops, DRAM, and other memory elements. Additionally, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 1:
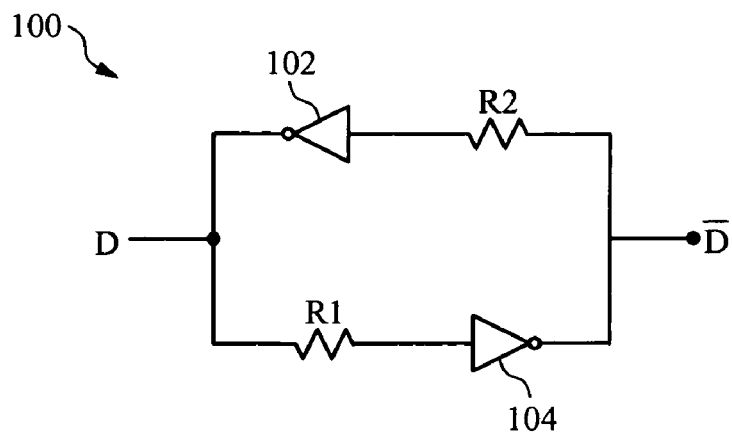
FIG. 1 is a schematic diagram of an SEU-resistant memory cell of the prior art.
Figure 2:
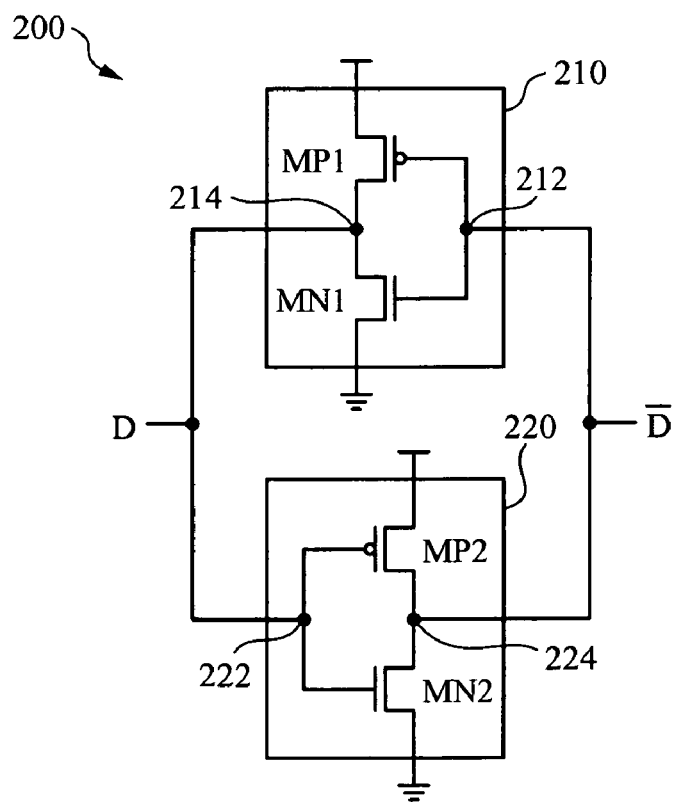
FIG. 2 is a schematic diagram of an exemplary embodiment of a memory cell in accordance with some embodiments of the present invention.

FIG. 2 is a schematic diagram of a latch 200 in accordance with some embodiments of the present invention. Latch 200 includes cross-coupled inverters 210 and 220 connected between complementary data terminals D and $\overline{D}$. Inverter 210 is formed by PMOS transistor MP1 and NMOS transistor MN1 coupled in series between a supply voltage $V_{DD}$ and ground potential. The common gate of transistors MP1 and MN1 forms an input 212 of inverter 210, and the drain regions of transistors MP1 and MN1 form an output 214 of inverter 210. Similarly, inverter 220 is formed by PMOS transistor MP2 and NMOS transistor MN2 coupled in series between $V_{DD}$ and ground potential. The common gate of transistors MP2 and MN2 forms an input 222 of inverter 220, and the drain regions of transistors MP2 and MN2 form an output 224 of inverter 220. As explained in detail below, the resistivities of the gate structures for inverters 210 and 220 may be sufficiently increased to provide SEU-hardening series resistances for latch 200 while consuming minimal, if any, silicon substrate area.

Figure 3:
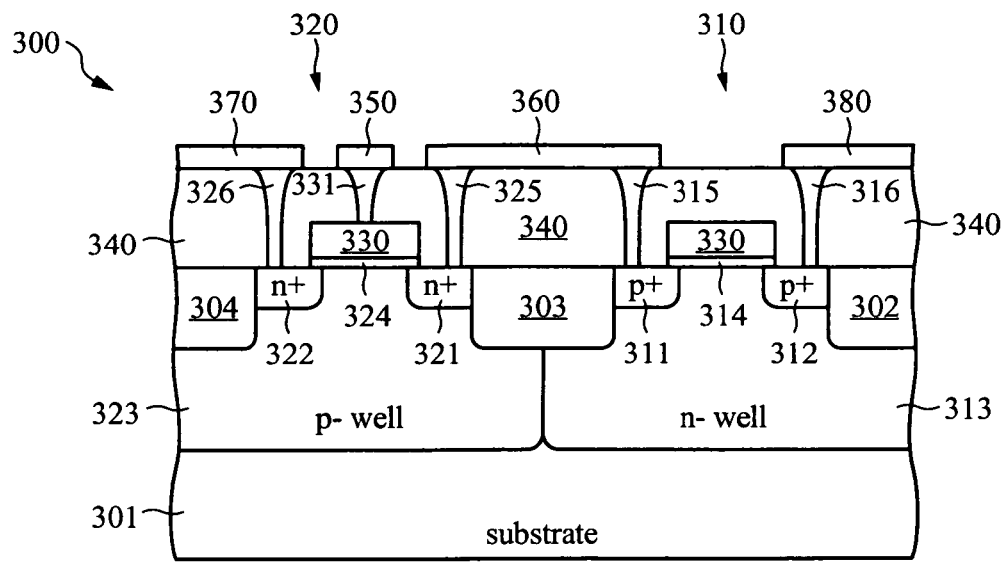
FIG. 3 is a cross-sectional view of a CMOS inverter having a gate structure in accordance with one embodiment of the present invention.
Figure 4:
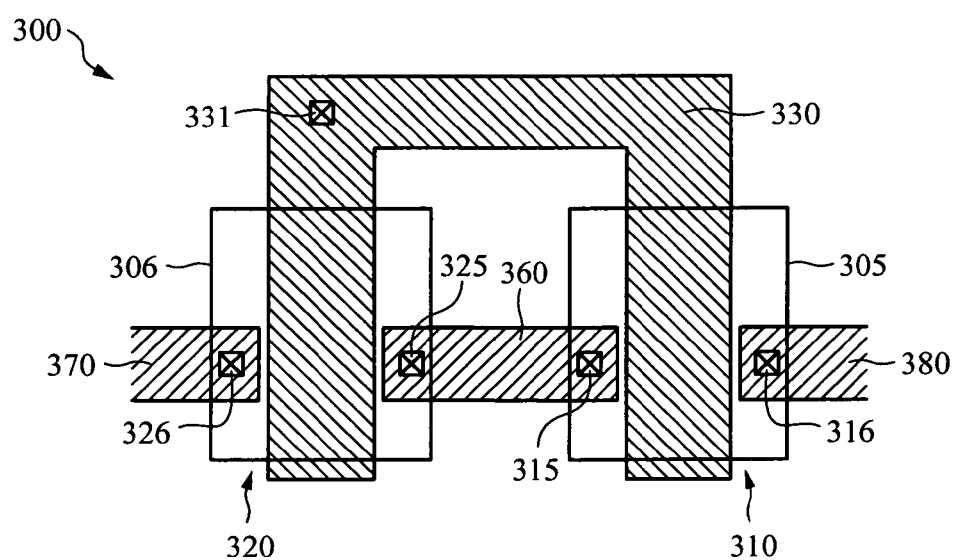
FIG. 4 is a top view of the CMOS inverter of FIG. 3.

FIGS. 3 and 4 show cross-sectional and top views of a CMOS inverter 300 that is one embodiment of CMOS inverters 210 and 220 of latch 200, although other transistor layout arrangements may be used. CMOS inverter 300 includes a PMOS transistor 310 and an NMOS transistor 320. PMOS transistor 310 includes p+ diffusion regions 311 and 312 formed in an n-well region 313 of a substrate 301. For one embodiment, p+ diffusion region 311 serves as the drain of transistor 310 and p+ diffusion region 312 serves as the source of transistor 310. A layer of gate oxide 314 is formed over n-well region 313 between p+ diffusion regions 311 and 312. Field oxide regions 302 and 303 provide electrical isolation for an active region 305 of transistor 310. NMOS transistor 320 includes n+ diffusion regions 321 and 322 formed in a p-well region 323 of substrate 301. For one embodiment, n+ diffusion region 321 serves as the drain of transistor 320 and n+ diffusion region 322 serves as the source of transistor 320. A layer of gate oxide 324 is formed over p-well 323 between n+ diffusion regions 321 and 322. Field oxide regions 303 and 304 provide electrical isolation for an active region 306 of transistor 320.

A polysilicon layer 330 serves as the gate electrode for both transistors 310 and 320, and is encapsulated by an insulating layer 340. Polysilicon gate 330 is connected to a first conductive trace 350 by a contact or plug 331 formed within insulating layer 340. The p+ diffusion region 311 and the n+ diffusion region 321 are connected to a second conductive trace 360 by contacts 315 and 325, respectively, formed in insulating layer 340. The n+ diffusion region 322 is connected to a third conductive trace 370 by a contact 326 formed in insulating layer 340, and the p+ diffusion region 312 is connected to a fourth conductive trace 380 by a contact 316 formed in insulating layer 340.

For some embodiments, the first conductive trace 350 provides an input signal to inverter 300, the second conductive trace 360 provides an output signal from inverter 300, the third conductive trace 370 is connected to ground potential, and the fourth conductive trace 380 is connected to $V_{DD}$. The conductive traces 350, 360, 370, and 380 may be any suitable conductive material including, for example, aluminum, polysilicon, or other suitable material, and may be formed using any well-known fabrication technique. As explained below, polysilicon gate 330 and plug 331 collectively form a gate structure for inverter 300 that may be modified in accordance with various embodiments to provide SEU protection.

In accordance with some embodiments of the present invention, the gate structure 330/331 of inverter 300 is fabricated to have a much higher resistivity than diffusion contacts 315, 316, 325, and 326. In this manner, the series resistance of gate structure 330/331 may provide SEU protection while consuming minimal, if any, silicon substrate area. More specifically, the resistivity of gate structure 330/331 is sufficiently high to provide SEU resiliency at the input of inverter 300. The series resistance provided by gate structure 330/331 may be several orders of magnitude greater than that of diffusion contacts 315, 316, 325, and 326. For one embodiment, the series resistance provided by gate structure 330/331 is between 10 kilo-ohms and 10 mega-ohms, while the series resistance of diffusion contacts 315, 316, 325, and 326 is less than 10 ohms. Preferably the series resistance provided by gate structure 330/331 is greater than 100 kilo-ohms in order to achieve sufficient radiation hardening, and less than 1 mega-ohm in order to achieve sufficient read/write speed.

Thus, referring also to FIG. 2, the series resistance of gate structure 330/331 for the input 222 of inverter 220 increases (i.e., slows) the RC time constant of the path from output 214 of inverter 210 to input 222 of inverter 220, thereby slowing the propagation of undesirable SEU transients from inverter 210 to inverter 220 so that inverter 220 has more time to reset inverter 210 to its correct state. Similarly, the series resistance of gate structure 330/331 for the input 212 of inverter 210 increases (i.e., slows) the RC time constant of the path from output 224 of inverter 220 to input 212 of inverter 210, thereby slowing the propagation of undesirable SEU transients from inverter 220 to inverter 210 so that inverter 210 has more time to reset inverter 220 to its correct state.

For some embodiments, a series resistance for gate structure 330/331 that is sufficient to provide SEU resiliency may be achieved by forming a suitably thin dielectric film or layer within a portion of plug 331. For example, referring to FIG. 5A, a gate structure 510 that is one embodiment of gate structure 330/331 of FIGS. 3 and 4 includes a plug 511 coupled between conductive trace 350 and polysilicon gate 330. Gate 330 is shown to include a layer of doped polysilicon 330A having a layer of salicide 330B formed thereon. Salicide layer 330B, which may be formed using any well-known technique and material (e.g., using titanium, cobalt, or other suitable metal), is commonly used in semiconductor circuits to reduce the resistance of polysilicon (e.g., polysilicon gate 330).

Plug 511 includes a resistive material 512 formed in a lower portion thereof, and a conductive material 513 formed in an upper portion thereof. The resistive material 512 may be any suitable dielectric material such as, for example, oxide, and the conductive material 513 may be any low resistivity material such as, for example, Tungsten, polysilicon, and the like.

The inclusion of dielectric layer 512 within plug 511 sufficiently increases the series resistance of plug 511 to provide SEU protection. The magnitude of this series resistance may be manipulated by adjusting the thickness of the dielectric layer 512 and/or adjusting the dopant concentration of conductive material 513. The formation of resistive material 512 within plug 511, as well as the formation and/or doping of conductive material 513, may be accomplished using well-known processing techniques. In addition, the dopant concentration of polysilicon layer 330A may be reduced to increase its resistivity, thereby increasing SEU resiliency. For one embodiment, the dopant concentration of polysilicon layer 330A is approximately 1E13 $cm^2$.

Figure 5A:
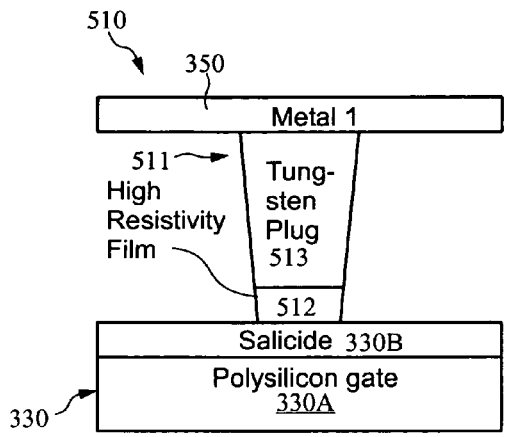
FIGS. 5A-5D are cross-sectional views of various embodiments of gate structures for the inverter of FIGS. 3 and 4.
Figure 5B:
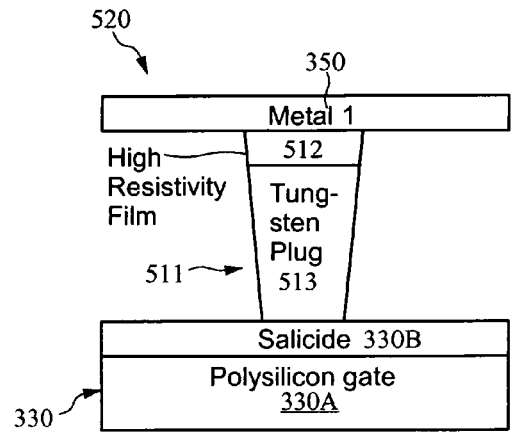

Alternatively, the resistive material 512 and conductive material 513 may be formed in top and bottom portions, respectively, of plug 511, as illustrated by gate structure 520 in FIG. 5B. Thus, gate structure 520 is another embodiment of gate structure 330/331 of FIGS. 3 and 4.

Figure 5C:
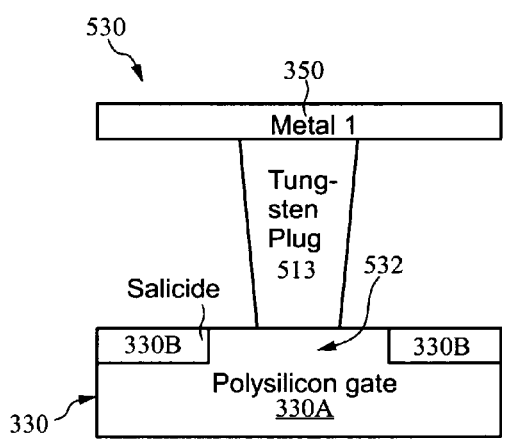

For other embodiments, SEU resiliency may be achieved by modifying the gate 330 so that portions of the gate 330 proximate to the plug do not include salicide. For example, FIG. 5C shows a gate structure 530 that is another embodiment of gate structure 330/331 of FIGS. 3 and 4. Gate structure 530 includes a conductive material 513 coupled between conductive trace 350 and gate 330. Conductive material 513 is formed in a well-known manner using, for example, Tungsten, polysilicon, or any other suitable low resistivity material. Gate 330 includes salicide layer 330B formed on doped polysilicon layer 330A.

However, unlike gate structures 510 and 520 (FIGS. 5A and 5B), the salicide layer 330B for gate structure 530 is not formed in a portion 532 of polysilicon layer 330A that underlies conductive material 513. With the omission of salicide 330B from gate portion 532, which may be achieved using well-known masking and/or etching techniques, gate structure 530 forms a high resistance junction with polysilicon layer 330A. This high resistance junction, in turn, provides SEU resiliency (e.g., for embodiments of latch 200).

Figure 5D:
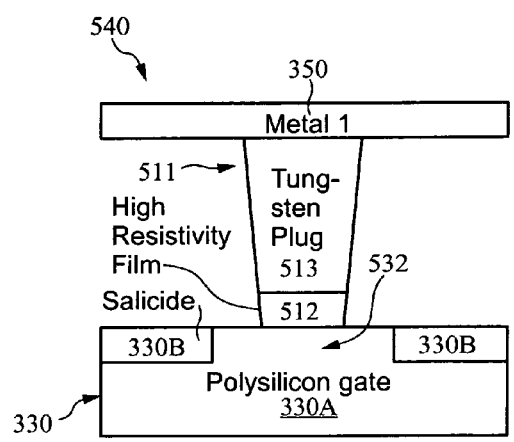

Further, embodiments of FIGS. 5A/5B may be combined with embodiments of FIG. 5C as illustrated, for example, in FIG. 5D, which shows a gate structure 540 that is another embodiment of gate structure 330/331 of FIGS. 3 and 4. Gate structure 540 includes plug 511 coupled between conductive layer 350 and a portion 532 of polysilicon layer 330A which does not have salicide formed thereon. For the embodiment of FIG. 5D, the dielectric layer 512, as well as the junction formed between plug 511 and polysilicon gate 330A, provides an SEU-hardening series resistance for gate structure 540.

Of course, for other embodiments of gate structure 540, dielectric layer 512 may be formed in a top portion of plug 511, and conductive material 513 may be formed in a bottom portion of plug 511.

In addition, although described above in the context of increasing the resistivity of gate structure 330/331 (FIGS. 3 and 4), the embodiments of FIGS. 5A-5B are equally applicable for increasing the resistivity of diffusion contacts 315 and 325, if desired.

Figure 6:
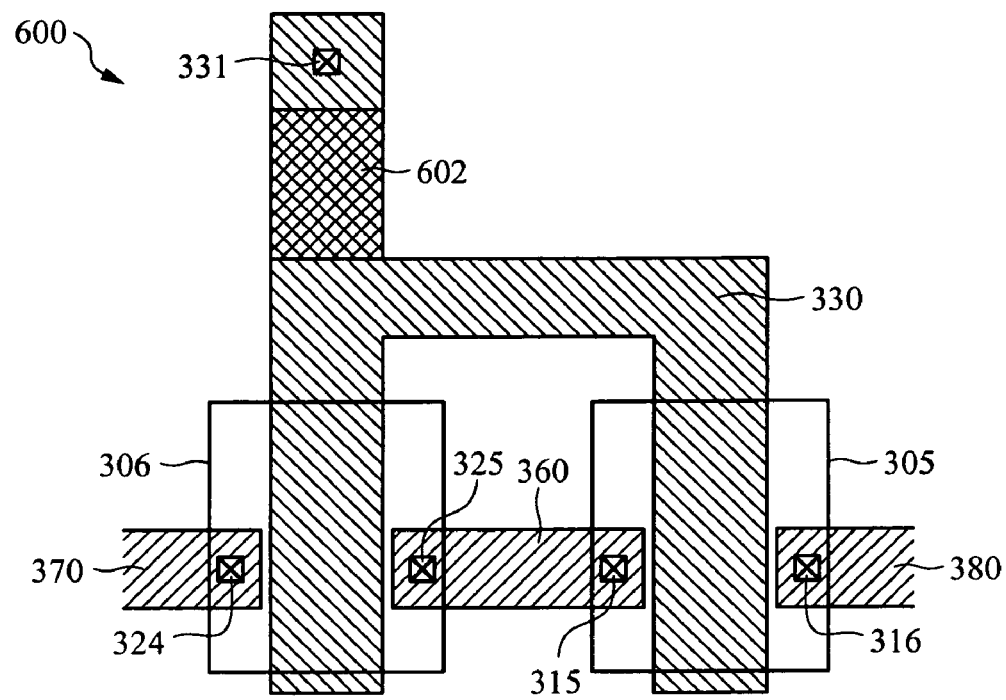
FIG. 6 is a top view of a CMOS inverter having a gate structure in accordance with another embodiment of the present invention.

For still other embodiments, SEU resiliency may be achieved by including high-resistivity regions within portions of gate 330 which do not underlie the plug 331 or 511. For example, FIG. 6 shows a top view of a CMOS inverter 600 that is another embodiment of inverter 200 of FIG. 2. Inverter 600 is similar to inverter 300 of FIGS. 3 and 4, except that polysilicon layer 330 of inverter 600 includes a high-resistivity region 602 that provides an SEU-hardening series resistance for inverter 600.

Figure 7A:
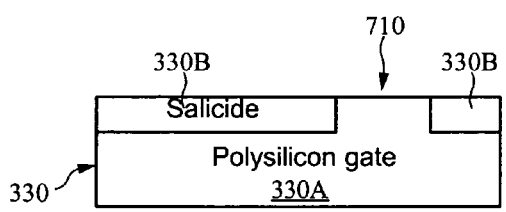
FIGS. 7A and 7B are cross-sectional views of various embodiments of gate structures for the inverter of FIG. 6.

For one embodiment, high-resistivity gate region 602 is formed by omitting the salicide in a portion of gate 330. For example, referring to FIG. 7A, gate 330 includes a polysilicon layer 330A having a layer of salicide 330B formed thereon. The formation of salicide layer 330B is masked in a portion 710 of polysilicon layer 330A using well-known masking techniques. As a result, gate portion 710, which is one embodiment of high-resistivity region 602, has a much higher resistivity than other portions of gate 330 upon which salicide layer 330B is formed. In this manner, gate portion 710 provides an SEU-hardening series resistance of between approximately 10 kilo-ohms and 10 mega-ohms for inverter 600. The magnitude of the SEU-hardening series resistance provided by unsalicided gate region 710 may be manipulated by adjusting the surface area of gate region 710.

Figure 7B:
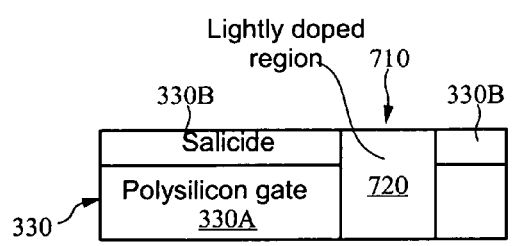

For another embodiment, the unsalicided gate region 710 may be more lightly doped than other portions of polysilicon gate 330A to further increase the SEU-hardening series resistance. Thus, referring to FIG. 7B, high-resistivity gate region 720 is a lightly doped (or undoped) and unsalicided polysilicon having a resistivity of between approximately 10 kilo-ohms and 10 mega-ohms per square, while other portions of gate 330A are formed of doped and salicided polysilicon having a resistivity of approximately 8 ohms per square. The magnitude of the SEU-hardening series resistance provided by unsalicided gate region 720 may be manipulated by adjusting the surface area of gate region 720 and/or adjusting the dopant concentration of gate portion 720.

For other embodiments, high-resistivity region 602 may be formed within conductive trace layer 350.

The large SEU-hardening resistances attainable by the various embodiments of gate structure 330/331 and high-resistivity region 602 makes latches which include cross-coupled inverters 300 and/or 600 well suited for use as a configuration memory cell for an FPGA. Because FPGA configuration memory cells are usually written to only during configuration of the FPGA, the write speeds for FPGA configuration memory cells are not critical during normal operation of the FPGA. As a result, the series resistance of gate structure 330/331 and high-resistivity region 602 may be maximized in order to provide maximum SEU protection for the configuration data that controls various selectable functions of the FPGA without adversely affecting FPGA performance during normal operation. Thus, for some embodiments, latches which include cross-coupled inverters 300 and/or 600 are used as configuration memory cells for an FPGA, as illustrated in FIG. 8.

Figure 8:
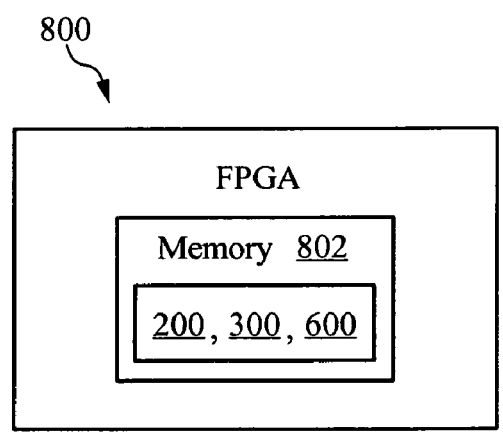
FIG. 8 is a block diagram of an FPGA within which embodiments of the present invention may be implemented.

FIG. 8 shows an FPGA 800 in accordance with one embodiment of the present invention. FPGA 800 includes a memory 802, which includes one or more latches 200 including inverters 300 and/or 600. For one embodiment, memory 802 includes FPGA configuration memory cells, although in other embodiments memory 802 may include other memory elements such as, for example, block RAM. Further, although memory 802 is shown internal to FPGA 800, in other embodiments memory 802 may be external to FPGA 800 and coupled thereto for communication of data, address, and/or control information.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of providing a single event upset (SEU) resistant memory cell, comprising:
   forming first and second cross-coupled inverters in a substrate, each of the inverters having a gate structure;
   wherein the gate structure comprises a polysilicon layer including two gate electrodes of the inverter and a plug coupled to the polysilicon layer;
   modifying the gate structure to include an SEU-hardening series resistance; and
   wherein the modifying of the gate structure includes modifying at least one of the polysilicon layer and the plug;
   wherein modifying the gate structure includes,
      saliciding portions of the polysilicon layer which do not underlie the plug, and
      masking salicide from portions of the polysilicon layer which underlie the plug.

2. The method of claim 1, wherein the SEU-hardening series resistance is between approximately 10 kilo-ohms and 10 mega-ohms.

3. The method of claim 1, wherein the SEU-hardening series resistance is not formed in the substrate.

4. The method of claim 1, wherein modifying the gate structure comprises:
   forming a conductive layer in the plug; and
   forming a dielectric layer in the plug, the dielectric layer providing SEU resiliency for the memory cell.

5. A method of providing a single event upset (SEU) resistant memory cell, comprising:
   forming first and second cross-coupled inverters in a substrate, each of the inverters having a gate structure;
   wherein the gate structure comprises a polysilicon layer including two gate electrodes of the inverter and a plug coupled to the polysilicon layer;
   modifying the gate structure to include an SEU-hardening series resistance; and
   wherein the modifying of the gate structure includes modifying at least one of the polysilicon layer and the plug;
   wherein modifying the gate structure includes,
      saliciding portions of the polysilicon layer which underlie the plug, and
      masking salicide from a portion of the polysilicon layer which does not underlie the plug to form an unsalicided portion of the polysilicon layer.

6. The method of claim 5, wherein the unsalicided portion of the polysilicon layer comprises lightly doped polysilicon.

7. The method of claim 5, wherein the unsalicided portion of the polysilicon layer comprises undoped polysilicon.

8. The method of claim 1, wherein the memory cell comprises a configuration memory cell in a field programmable gate array.

9. The method of claim 5, wherein the SEU-hardening series resistance is between approximately 10 kilo-ohms and 10 mega-ohms.

10. The method of claim 5, wherein the SEU-hardening series resistance is not formed in the substrate.

11. The method of claim 5, wherein modifying the gate structure comprises:
   forming a conductive layer in the plug; and
   forming a dielectric layer in the plug, the dielectric layer providing SEU resiliency for the memory cell.

* * * * *